United States Patent [19]

Laupman

[11] 4,157,511

[45] Jun. 5, 1979

[54] ELECTRONIC REVERBERATION DEVICE

[75] Inventor: Robert R. Laupman, Wijchen, Netherlands

[73] Assignee: Novanex Automation N.V., Wijchen, Netherlands

[21] Appl. No.: 861,283

[22] Filed: Dec. 16, 1977

[30] Foreign Application Priority Data

Dec. 17, 1976 [NL] Netherlands .......................... 7614040

[51] Int. Cl.[2] .............................................. H03F 1/36

[52] U.S. Cl. ..................................... 330/107; 84/1.24; 179/1 J; 330/109

[58] Field of Search ............... 84/1.24, 1.25, DIG. 26; 330/294, 107, 109; 179/1 J

[56] References Cited

U.S. PATENT DOCUMENTS

| | | | |
|---|---|---|---|
| 3,110,771 | 11/1963 | Logan, Jr. et al. | 179/1 J |
| 3,157,725 | 11/1964 | Wayne, Jr. | 84/1.24 |

*Primary Examiner*—Lawrence J. Dahl

[57] ABSTRACT

An electronic reverberation device comprising an input amplifier and an output amplifier connected in a circuit in which a delay device is connected between an output of the input amplifier and an input of the output amplifier, and a feedback path connects an output of the output amplifier to an input of the input amplifier. In order to render the operation of the device substantially frequency-independent, the delay line is a variable delay line the delay of which can be regulated by a regulator controlled by a control device which derives a control voltage from the output of the input amplifier. Preferably, the delay device is a bucket memory, the regulator a clock, and the control device comprises a diode having one terminal connected to the output of the input amplifier and another that is earth-connected through a capacitor and connected through a resistor to a control input of the clock.

4 Claims, 2 Drawing Figures

ELECTRONIC REVERBERATION DEVICE

The invention relates to an electronic reverberation device.

In Dutch patent application No. 7510999, there is described an electronic reverberation device comprising an input amplifier, a delay device, an output amplifier connected through said delay device to said input amplifier, and a feedback path connected between an output of the output amplifier and an input of the input amplifier.

It has been found that such a reverberation device has the drawback that the combined signal supplied to the input amplifier suffers from a so-called comb filter effect.

This effect is a result of the fact that at certain frequencies of the initial input signal, the fed-back signal is in phase with, and hence increases this input signal, whereas at other frequencies the returned signal is in phase opposition to the initial input signal, so that the latter is decreased.

This means that the characteristic curve of the echo signal as a function of the frequency will have a comb-shaped configuration. In practice, this comes down to the reverberation device producing a long echo at certain frequencies, and practically none at all at others.

It is clear that such an effect may be quite annoying and reduce the quality of the installation in which the reverberation device is used.

It is an object of the present invention to substantially reduce, if not eliminate, the effect described in a simple manner.

According to the present invention, the delay device is a variable delay line, the delay of which can be regulated by a regulator, there being provided a control device between the output of the input amplifier and a control input of said regulator, which control device controls the regulator so that the sum of the signal from the delay device and re-supplied to the input amplifier through the feedback path and the original input signal of the input amplifier is substantially frequency-independent.

According to a preferred feature of the present invention, the delay device comprises a bucket memory, and the regulator is a clock whose frequency can be varied by the control device.

In a preferred embodiment of the present invention, the frequency of the clock is varied by the control device in response to the output signal from the input amplifier.

According to another preferred feature of the present invention, the control device comprises a diode, one terminal of which is connected to the output of the input amplifier, and the other terminal of which is earth-connected through a capacitor and connected through a resistor to the control input of the regulator.

One embodiment of the present invention will now be described, by way of example, with reference to the accompanying drawings. In said drawings, FIG. 1 is a diagram of a reverberation device of known type, as described, for example, in the above Dutch patent application No. 7510999; and FIG. 2 is a diagram illustrating one embodiment of an electronic reverberation device according to the present invention.

Figure 1:
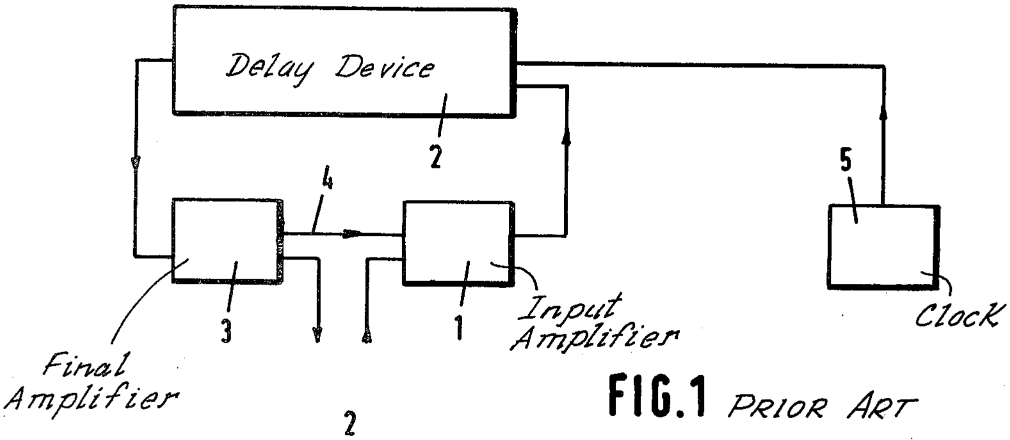
FIG.1 PRIOR ART
Figure 2:
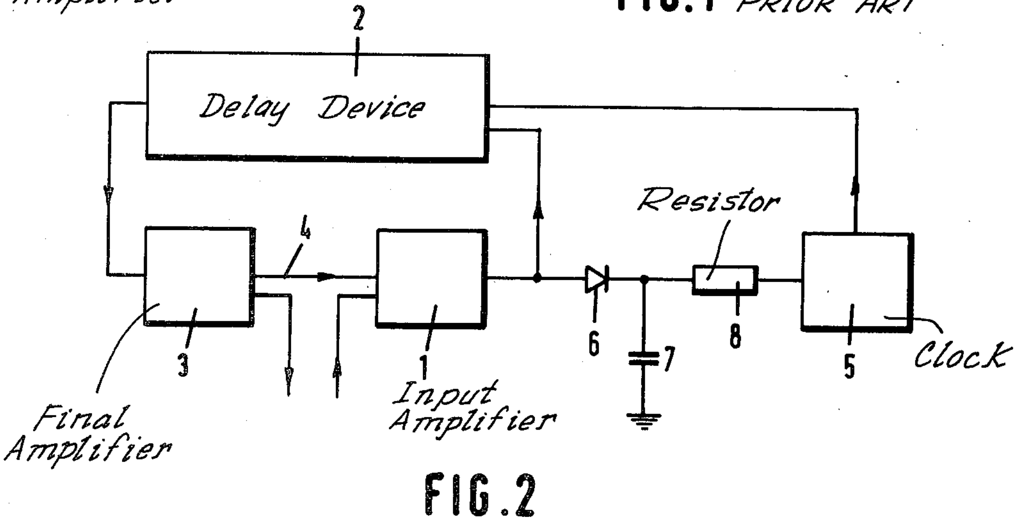

As shown in FIG. 1, an electronic reverberation device of known type comprises an input amplifier 1, to which an initial input signal can be supplied, as diagrammatically shown by an arrow. The output of input amplifier 1 is connected to a first input of a delay device 2, the output of which is connected to a final amplifier 3, capable of producing an output signal at one output, as diagrammatically shown in the drawing by an arrow. A second output of amplifier 3 is connected through a feedback path 4 to a second input of input amplifier 1. The device further comprises a clock 5, connected to a second input terminal of delay device 2.

In a device of this kind, in which a feedback path 4 is used, an initial input signal is supplied to input amplifier 1, whose output signal travels through delay line 2 to produce a signal at the output thereof and hence at the output of output amplifier 3 connected to it and at the input terminal of input amplifier 1, connected to the output of output amplifier 3 through feedback path 4. It is clear that when the initial input signal has a given frequency the fed-back signal normally differs in phase from the initial signal. In an extreme case the signal supplied to input amplifier 1 through feedback path 4 may be in phase opposition to the initial signal supplied to input amplifier 1, which means that at that particular frequency a short echo is produced.

It is also possible, however, that at a different frequency of the initial input signal the signals supplied to the inputs of input amplifier 1 are of corresponding phase, which implies that an echo of maximum length is produced at that frequency.

All this means, therefore, that the characteristic curve of the reverberation signal produced by the device has a comb-shaped configuration as a function of the frequency of the input signal. This, as stated above, is experienced as a drawback when the reverberation device is used in audio amplifier systems.

In order to remedy this drawback, the present invention uses a principle, one implementation of which is diagrammatically shown in FIG. 2 of the accompanying drawings.

The circuitry illustrated in FIG. 2 comprises all the parts shown in FIG. 1, which are designated by the same reference numerals.

Unlike the arrangement of FIG. 1, however, in the device of FIG. 2, the output of input amplifier 1 is in addition connected through a diode 6 and a resistor 8 to a control input 9 of clock 5. The input terminal of resistor 8 is furthermore earth-connected through a capacitor 7.

In this manner a control voltage is derived from the output of input amplifier 1, the value of which voltage varies with that of the input signal supplied to input amplifier 1.

The operation of the device is as follows:

Let it be assumed that when the input signal of input amplifier 1 increases, the regulating voltage also increases.

When clock 5 is constructed so that when the voltage at control input 9 of clock 5 increases the frequency of the clock increases too, an increasing input signal of input amplifier 1 will cause the frequency of the clock to increase, and the siganl supplied to it from input amplifier 1 will travel faster through delay device 2. In essence, this comes down to the signal at the output of delay device 2 being changed in phase. This in turn means that the phase of the signal supplied through feedback path 4 to the input of input amplifier 1 will change in phase relatively to the initial input signal.

By way of illustration it will be assumed that this change is such that the input signal is decreased. In that case the control voltage of the clock will no longer increase, and a condition of equilibrium will be established.

If, however, as a result of the change in phase, the signal at the input of input amplifier 1 is increased, the control voltage at input 9 of clock 5 will increase further, as a result of which the clock will produce a still higher frequency and further change the phase of the signal at the output of delay device 2 so that a decrease will occur at the input of input amplifier 1, whereby a new condition of equilibrium will be established.

It is clear that in response to a decrease of the input signal of input amplifier 1 the frequency of clock 5 will be decreased, and the output signal of delay device 2 will consequently change in phase so that a voltage will be generated at the regulating input of clock 5, which re-adjusts the clock so as to re-establish a condition of equilibrium in the system.

It has been found that capacitor 7 and resistor 8 can be so matched to the input sensitivity of clock 5 that at any frequency of the input signal of input amplifier 1 the signal fed-back through feedback path 4 to the input of input amplifier 1 will increase the initial input signal, as a result of which the above comb filter effect is substantially reduced, if not eliminated.

It is clear that it is not necessary for the frequency of clock 5 to increase in response to an increase in the control voltage at the control input of the clock. It is equally conceivable that the frequency decreases in that case. The effect is exactly the same as that described before.

Nevertheless, the regulating method first described is preferred in certain cases for the following reasons.

A reverberation device as described, for example, in Dutch patent application No. 7510999 and provided with a feedback path is often used for creating a background reverberation for singing. It appears in practice that as a singer stops singing a given tone, the frequency of the tone tends to decrease.

When the device described above is operated in the manner indicated, with the frequency of the output signal of clock 5 increasing with an increasing control voltage at the control input of the clock, it turns out that the condition of equilibrium is reached earlier, the effect is highly stable, and the reverberation has a maximum value.

It is again pointed out, however, that such a regulating method is preferred in certain cases, but that the present invention is not so limited.

I claim:

1. An electronic reverberation device comprising an input amplifier having an input and an output, an output amplifier having an input and an output, a delay device connected between said output of said input amplifier and said input of said output amplifier, a feedback path connected between said output of said output amplifier and said input of said input amplifier, said delay device being a variable delay line, a regulator for regulating the delay of said delay device and having a control input, and a control device between said output of said input amplifier and said control input of said regulator, said control device controlling said regulator such that the sum of the signal from said delay device and re-supplied to said input amplifier through said feedback path and the input signal of said input amplifier is substantially frequency-independent.

2. A reverberation device according to claim 1, wherein said delay device comprises a bucket memory, and said regulator is a clock whose frequency can be varied by the control device.

3. A reverberation device according to claim 1, wherein the control device varies the frequency of the clock in response to the output signal of the input amplifier.

4. A reverberation device according to claim 1, wherein the control device comprises a diode, one terminal of which is connected to the output of the input amplifier and, a capacitor and a resistor, said diode being earth-connected through said capacitor and connected through said resistor to the control input of the regulator.

* * * * *